US010141039B2

(12) United States Patent
Andre et al.

(10) Patent No.: US 10,141,039 B2
(45) Date of Patent: Nov. 27, 2018

(54) BURST LENGTH DEFINED PAGE SIZE

(71) Applicant: Everspin Technologies, Inc., Chandler, AZ (US)

(72) Inventors: Thomas Andre, Austin, TX (US); Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/495,083

(22) Filed: Sep. 24, 2014

(65) Prior Publication Data

US 2015/0254181 A1    Sep. 10, 2015

Related U.S. Application Data

(60) Provisional application No. 61/950,501, filed on Mar. 10, 2014.

(51) Int. Cl.
| G06F 12/08 | (2016.01) |
| G11C 11/16 | (2006.01) |
| G06F 12/0806 | (2016.01) |
| G06F 12/0879 | (2016.01) |
| G11C 7/10 | (2006.01) |

(Continued)

(52) U.S. Cl.
CPC ...... *G11C 11/1675* (2013.01); *G06F 12/0806* (2013.01); *G06F 12/0879* (2013.01); *G11C 7/1018* (2013.01); *G11C 7/1045* (2013.01); *G11C 7/22* (2013.01); *G11C 11/16* (2013.01); *G11C 11/1655* (2013.01); *G11C 11/1657* (2013.01); *G11C 11/1659* (2013.01); *G11C 11/1673* (2013.01); *G11C 11/1693* (2013.01);

*G06F 2212/62* (2013.01); *G11C 7/12* (2013.01); *G11C 11/4091* (2013.01);
(Continued)

(58) Field of Classification Search
CPC ............. G06F 12/0806; G06F 12/0879; G06F 2212/62; G11C 7/22; G11C 7/12; G11C 11/4094; G11C 11/419; G11C 11/4091; G11C 11/1659; G11C 11/5607; G11C 11/16; G11C 11/1657; G11C 7/1045; G11C 11/1675; G11C 7/1018; Y02B 60/1225
See application file for complete search history.

(56) References Cited

U.S. PATENT DOCUMENTS 6,728,798 B1 *   4/2004   Roohparvar ......... G11C 7/1018
                                                        710/25
8,792,269 B1     7/2014   Abedifard et al.
(Continued)

OTHER PUBLICATIONS

PCT Search Report and Written Opinion dated Jul. 7, 2015 for PCT application No. PCT/US2015/019404, 8 pages.
(Continued)

*Primary Examiner* — David X Yi
*Assistant Examiner* — Zubair Ahmed
(74) *Attorney, Agent, or Firm* — Bookoff McAndrews, PLLC

(57) ABSTRACT

In some examples, a memory device is configured with a reduced command set and a variable burst length. In some instances, the variable burst length defines a page size associated with data to be loaded into a cache. In other instances, the variable burst length may be set on the fly per read/write command and, in some cases, the burst length may be utilized to define the page size associated with the read/write command.

19 Claims, 8 Drawing Sheets

(51) Int. Cl.
  *G11C 7/22* (2006.01)
  *G11C 7/12* (2006.01)
  *G11C 11/4094* (2006.01)
  *G11C 11/419* (2006.01)
  *G11C 11/4091* (2006.01)
  *G11C 11/56* (2006.01)

(52) U.S. Cl.
  CPC ......... *G11C 11/4094* (2013.01); *G11C 11/419* (2013.01); *G11C 11/5607* (2013.01); *Y02B 60/1225* (2013.01)

(56) References Cited

U.S. PATENT DOCUMENTS

| | | |
|---|---|---|
| 2001/0040827 A1 | 11/2001 | Dosaka et al. |
| 2002/0057446 A1 | 5/2002 | Long et al. |
| 2007/0206420 A1 | 9/2007 | Roohparvar |
| 2009/0157983 A1 | 6/2009 | Bowyer |
| 2009/0235020 A1 | 9/2009 | Srinivasan et al. |
| 2010/0091537 A1* | 4/2010 | Best .................... G11C 5/02 365/51 |
| 2011/0205824 A1 | 8/2011 | Kajigaya |
| 2013/0201770 A1* | 8/2013 | Harris .................. G11C 5/025 365/189.011 |
| 2014/0286087 A1* | 9/2014 | Fujita ................ G11C 11/1673 365/158 |
| 2014/0372664 A1* | 12/2014 | Cho ...................... G06F 12/02 711/102 |
| 2015/0254181 A1 | 9/2015 | Andre et al. |

OTHER PUBLICATIONS

Supplemental European Search Report and Written Opinion dated Oct. 9, 2017 in corresponding EP Application No. 15762428, 8 pages.

* cited by examiner

BURST LENGTH DEFINED PAGE SIZE

RELATED APPLICATION

This application claims priority to U.S. Provisional Application No. 61/950,501 to Andre et al., entitled "Pipelined MRAM Architectures and Circuits and Methods of Manufacturing and Operating Same," filed Mar. 10, 2014, the contents of which are incorporated herein by reference in their entirety.

BACKGROUND

In magnetic memory devices, such as magnetic random access memories (MRAMs), the energy consumption rate of an MRAM may be higher than comparable non-magnetic memory devices, such as dynamic random access memories (DRAMs).

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
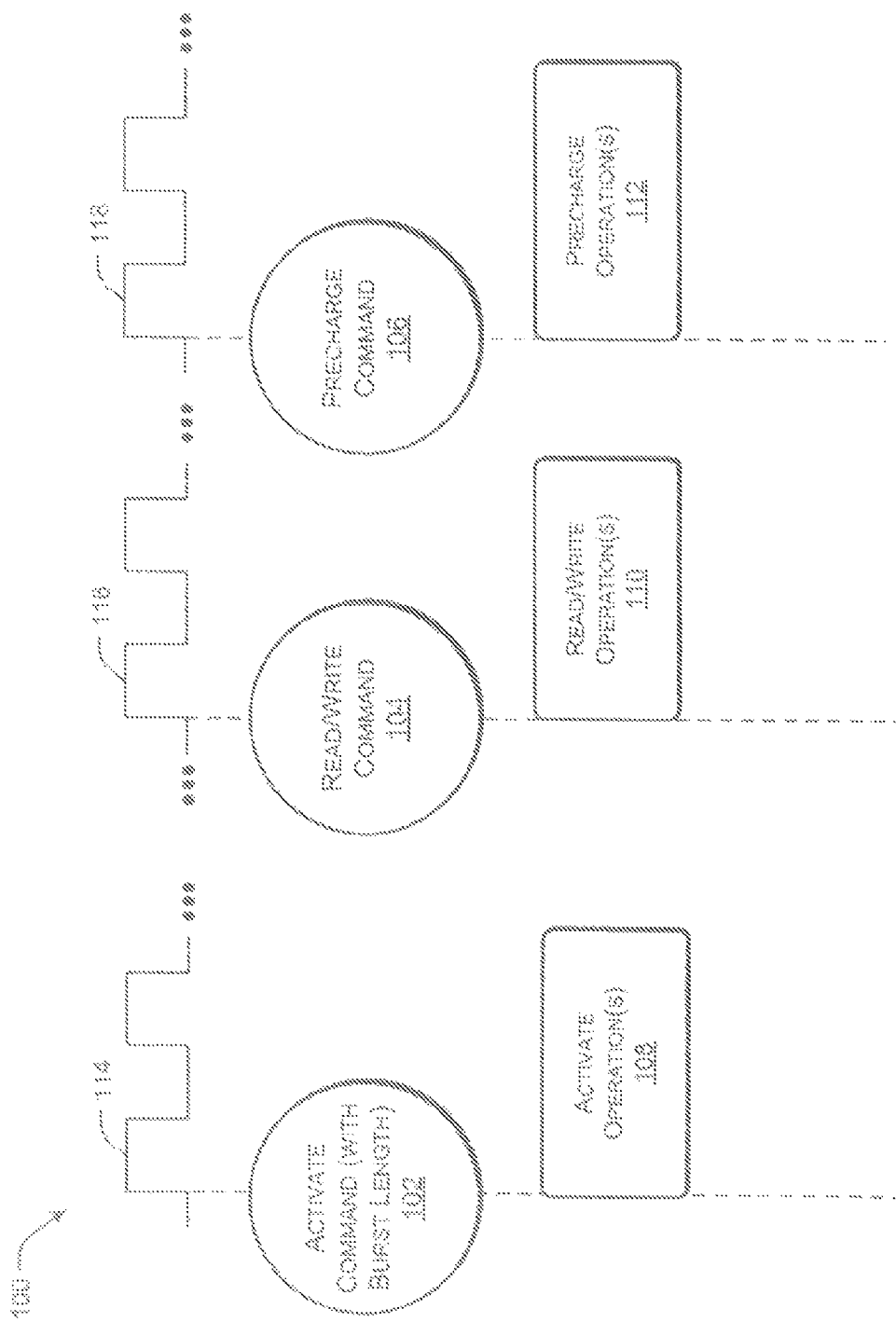
FIG. 1 illustrates an example timing diagram associated with processing commands at a memory device according to some implementations.

This disclosure includes techniques and implementations to improve flexibility and compatibility of memory devices. For example, dynamic random access memories (DRAMs) and memory controllers associated with DRAMs are typically configured to access very large pages in order to minimize page refreshing. However, by including a large page size to minimize page refreshing, in some cases, may cause additional power to be required when an external source is accessing only a subset of the data associated with a page. Additionally, some types of memory devices, such as magnetic memories, are configured to perform self referencing reads (which may require switching each bit in order for the data stored in the memory device to be read), In these types of devices, energy consumption rates often increase as the page size is increased. Therefore, in some implementations described herein, memory devices are configured to store data in a memory device having memory arrays configured with pages or rows consisting of as few as 8 bytes per page.

In other implementations, the number of pages associated with a bank access may be defined based in part on the burst length (e.g., the number of bytes associated with a read or write command) and in part on a size and number of arrays associated with each memory device. In some examples, the burst length may be defined during manufacturing of the electronic device incorporating the magnetic memory (e.g., via one or more fuse programmable registers), at the time that the electronic device is activated (e.g., via one or more initialization registers), and/or "on the fly" (e.g., via a mode register set as part of an activate command issued prior to a read or write command).

In some implementations, the burst length may be utilized to determine the number of arrays within a memory device associated with a single page and the number of banks to activate during each memory access. As an illustrative, non-limiting example, if a memory device includes memory arrays with internal page size of 32 bytes and a programmable burst length of either 16× (e.g., 16 words per page, each word containing 2 bytes or 32 bytes per page) or 32× (e.g. 32 words per page, each word containing 2 bytes or 64 bytes per page), twice the number of banks may be activated in the 32× burst length than when the 16× burst length is selected. Thus, in some implementations, a memory device having both a 16× burst length and a 32× burst length may have twice the number of arrays as a memory device having only a 32× burst length. Further, if an 8× burst length option is also enabled, the bank size may be set to 16 bytes and four times the number of arrays may be activated in response to a memory access than when the memory device is in the 32× burst length mode.

In some cases, such as on the fly defined burst length, a starting position may also be defined. For example, the activate command may include the burst length (e.g., a number of bytes or pages to read) and a starting position within a page indicating a first bit to be read.

In other implementations, the memory device may be configured to receive and/or perform auto precharge commands in response to or as part of a read or write command. For example, the memory device may be configured to receive an activate command followed by a read/write command with auto precharge. In some cases, a type of command associated with the read/write command with auto precharge may be determined by the memory device based on a 2 bit identifier, for example, "00" may identify a no operation command, "01" may identify a read-precharge command, "10" may identify a write-precharge command, and "11" may identify a read-write-precharge command. In this manner, a more streamlined command pipeline may be utilized for accessing each bank of a memory device.

In an alternative implementation, the memory device may be configured to receive a single command with respect to each read/write operation. In this implementation, the read/write commands may be configured with both an auto precharge command and an auto activate command. For example, the single command may be selected from a command set including an activate-read-precharge command, an activate-write-precharge command, and an activate-read-modify-write-precharge command. In this implementation, the command type may be identified using 2 pins. For example, "00" may be assigned to no operation, "01" may be assigned to active-read-precharge, "10" may be assigned to activate-write-precharge, and "11" may be assigned to activate-read-modify-write-precharge.

FIG. 1 illustrates an example timing diagram 100 associated with processing commands at a memory device according to some implementations. The timing diagram 100 illustrates events associated with an external source (e.g., a memory device controller) accessing a page of data stored within a memory device implementing burst length defined page sizes. In general, a predetermined series of commands and operations are received and performed in sequence to accomplish one or more read and/or write operations. The series of commands may include an activate command 102 to open a page from a memory device and load the associated page into the cache, one or more read and/or write commands 104 to edit the contents of the page while stored in the cache, and a precharge command 106 to close the page by writing the cache bits back into the memory device.

The operations are typically performed in sequence with no overlap to avoid errors and/or collisions in the cache. The execution of each set of operations is also subject to timing requirements following the receipt of the corresponding command by the memory device. For example, the external source reading or writing data to the page may wait for a first period of time after issuing an activate command. This first period first input of time is typically referred to as activate to internal read or write delay time and represents a number of clock cycles available to the memory device to complete one or more activate operations 108 (e.g., the operations associated with the activate command 102) or a number of clock cycles between receiving the activate command 102 and receiving at least one read or write command 104.

The external source may wait a second period of time following the issuance of each of the read/write commands. This second period of time may represent the number of clock cycles available to the memory device to complete one or more read/write operations 110 (e.g., operations associated with each read or write command 104) or the number of clock cycles between receiving a read or write command and receiving at least one read, write, or precharge command.

In some examples, the external source may wait a third period of time following the issuance of a precharge command to the memory device. This third period of time is typically referred to as row precharge time and represents the number of clock cycles available to the memory device to complete one or more precharge operations 112 (e.g., operations associated with the precharge command 106) or the number of clock cycles between receiving the precharge command 106 and receiving another activate command 102.

In the illustrated example, the timing diagram 100 is shown from the perspective of the memory device as the memory device receives commands from the external source and performs one or more activate operations 108, one or more read and/or write operations 110, and one or more precharge operations 112 associated with the commands 102, 104, and 106. In general, the timing diagram 100 is illustrated based on clock signals and includes illustrated clock signals 114, 116, and 118. It should be understood that a length of time of each clock signal, a length of time between each of the clock signals, and a total number of clock signals, as well as the number of clock signals associated with each of the illustrated operations are implementation details and that additional clock cycles may exist between clock signals 114 and 116, between clock signals 116 and 118, and following clock signal 118.

In the illustrated example, the memory device is shown as performing activate operation(s) 108 in response to receiving an activate command 102, read/write operation(s) 110 in response to receiving a read/write command 104, precharge operation(s) 112 in response to receiving a precharge command 106. In this example, the activate command 102 includes a burst length to define a page size associated with the read/write command 104. In some cases, the page size may be very small, for e.g. 256 bits. For instance, magnetic memory devices may be configured to perform self referencing reads in which each bit is switched in order for the bit to be read by the memory device. In some cases, utilizing self referencing reads results in energy consumption rates increasing as the page size is increased. Therefore, in some implementations described herein, the activate commands 102 may be configured to include a burst length that defines a page size associated with a particular read/write command 104 that follows a particular activate command 102. Thus, in these implementations, the activate command 102 may define the page size on the fly in order to minimize the number of bits accessed during a particular read/write operation.

In the illustrated example, the burst length is included as part of the activate command 102. Thus, the external source accessing the memory device may define the page size on the fly or at the time that the activate command 102 is issued. For example, the memory device may load the burst length into one or more mode registers after receiving the activate command 102. In other examples, the burst length may be defined upon initialization of the memory device, for instance, via one or more initialization or mode registers. In this example, the initialization or mode registers may be programmed or changed via a memory device service mode or other system repair/maintenance mode associated with an electronic device. In another example, the burst length may be defined at time of installation, for instance, via a fuse programmable register.

In some implementations, the burst length may be selected by the external source when issuing the activate command, for example, by including one or more mode selector bits associated with the activate command 102 to define the burst length. In some cases, the number of options associated with the burst length may be based on a size of the banks associated with the memory device. For instance, in one particular example, the memory device may be configured to implement both a 64 byte and a 32 byte page. In this instance, each of the memory arrays may be 32 bytes internal page and configured to be accessible independently of each other. Thus, when the 32 byte page size is selected each array may correspond to a page and when the 64 byte page size is selected two memory arrays may correspond to a page.

In this manner, the memory device may allow the external source to select between a burst length of 16× (a page size of 32 bytes) and 32× (a page size of 64 bytes). For example, the external source may select the burst length by setting a mode selector bit included as part of the activate command 102. The memory device may then set a mode register based on the mode selector bit to define the burst length for the following read/write command 104, thereby reducing power consumption associated with each of the activate commands 102. By utilizing the variable burst length, the size of the page loaded into the cache is more closely associated with the number of bits to be accessed and fewer bits are switched as part of the self referencing read.

In some cases, such as on the fly defined burst length, a starting position, as well as a burst length may be defined, as part of the activate command 102. In this example, the activate command 102 may include a first mode selector bit to define the burst length and a second bit to define a starting position within a page for the read/write command 104. Additionally, in this example, the burst length is not fixed to one or more preselected lengths and may be tailored more directly to the number of bits or bytes being accessed, thereby reducing overall power consumption.

In general, following receipt of the activate command 102 including the burst length, the memory device performs activate operation(s) 108 to load a page of the page size defined by the burst length into the cache. Once the page is stored in the cache, the memory device performs the read/write operation(s) 110. For example, the external source may read and/or write data by issuing one or more read/write commands 104.

In the illustrated example, a single read/write command 104 is received as part of an activate-read/write-precharge command sequence. However, in some cases, the external source may issue multiple read/write commands 104 sequentially to perform multiple operations to the data associated with the page loaded into the cache during the activate command 102. For example, the external source may issue a read command followed by a write command, and the memory device may perform a first set of operations associated with the read command and a second set of operations associated with the write command.

Once the external source is finished reading and/or writing the data stored in the cache, the external source may issue the precharge command 106 to the memory device. In response to receiving the precharge command 106, the memory device performs the precharge operation(s) 112 to write the data associated with the page back into the memory array.

Figure 2:
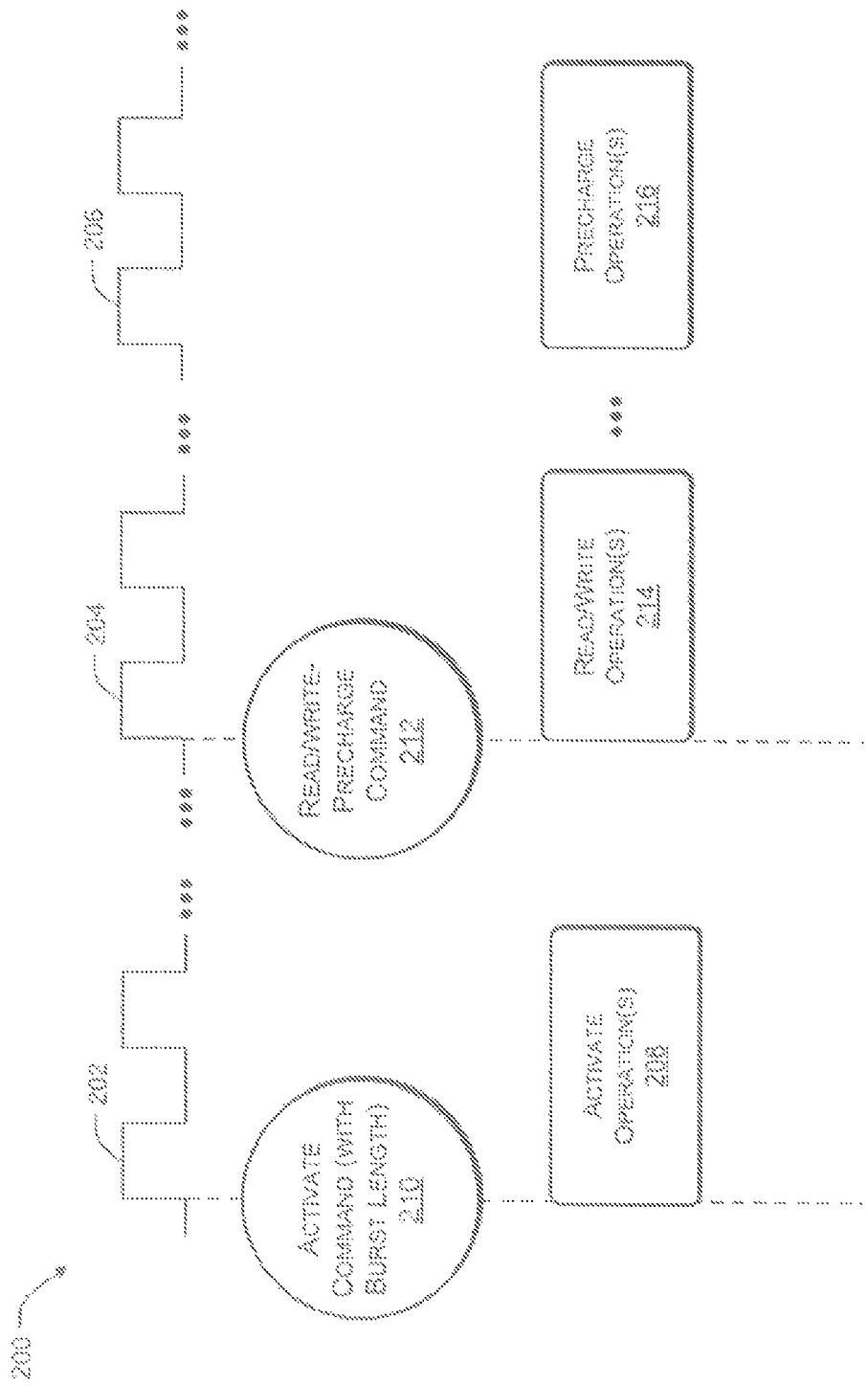
FIG. 2 illustrates another example timing diagram associated with processing commands at a memory device according to some implementations.

FIG. 2 illustrates another example timing diagram 200 associated with processing commands at a memory device according to some implementations. As with the timing diagram 100 of FIG. 1, the timing diagram 200 of FIG. 2 illustrates events associated with an external source (e.g., a memory device controller) accessing a page of data from the memory device. The timing diagram 200 is illustrated from the perspective of the memory device receiving commands from the external source. The timing diagram 200 is illustrated based on clock signals and includes illustrated clock signals 202, 204, and 206. It should be understood that a length of time associated with each of the clock signals, a length of time between each of the clock signals, and a total number of clock signals, as well as the number of clock signals to perform each of the illustrated operations are implementation details and that additional clock cycles may exist between clock signals 202 and 204, between clock signals 204 and 206, and following clock signal 206.

In the illustrated example, the memory device performs one or more activate operations 208 to load a page of a page size defined based on the burst length (for example, as defined by a fuse programmable register, an initialization register, or a mode register set in response to reading one or more mode selector bits associated with an activate command 210) into a cache. The external source may also issue one or more of the combined read/write-precharge command 212. In the response, the memory device may perform the read/write operations 214 to read/write the data stored in the cache. Following, the read/write operations 214, the memory device performs the precharge operations 216 to write the data in the cache back into a memory array. For example, in some cases, magnetic memory devices remain volatile and errors may be introduced into the data until the precharge operation(s) 216 are performed. Therefore, by following each read/write operation 214 with an associated auto precharge operation 216, the magnetic memory device may experience improved reliability and may become more stable over time.

In some cases, by combining the read/write command with the precharge command, multiple read/write operations may no longer be performed, while the page is stored in the cache. In this case, the benefit of loading large pages may be further minimized. Therefore, by defining the page size based on the number of bits being accessed (for example, via a burst length defined page size), both the energy consumption associated with self referencing reads and the number of un-accessed bits loaded into the cache may be reduced.

For example, as described above with respect to FIG. 1, the activate command 210 may include one or more mode selector bits to define a burst length associated with a corresponding read/write-precharge command 212. In this example, the page size may be defined on the fly to closely match the number of bits actually being read or written. In some cases, the burst length may be relatively small, for instance, 4× (e.g., page size of 16 bytes) or even 2× (e.g., a page size of 8 bytes).

In some implementations, the memory device may be configured to be accessed without column addressing. In these implementations, the burst length may be predefined by the fuse programmable registers or the initialization registers. In other implementations, the burst length may be defined on the fly as part of the activate command 210 defines the number of bytes to be accessed during the read/write operations 214 to be an entire row or page of data. In some cases, the row or page may be defined based at least in part on a size associated with individual arrays associated with a memory device or directly with respect to the size of the memory array. For example, each array may be configured to be activated individually, such that each array may be accessed as a separate page. Thus, in this example, each memory address may be associated with a single array, such that when the external source accesses a particular memory address, an entire page or the data associated with a particular array is loaded into the cache, the read/write operations 214 are performed, and the page is written back into the memory array. This particular example allows for improved overlapping of memory array accesses, as well as minimizing energy wasted by loading unaccessed bits into the cache.

Figure 3:
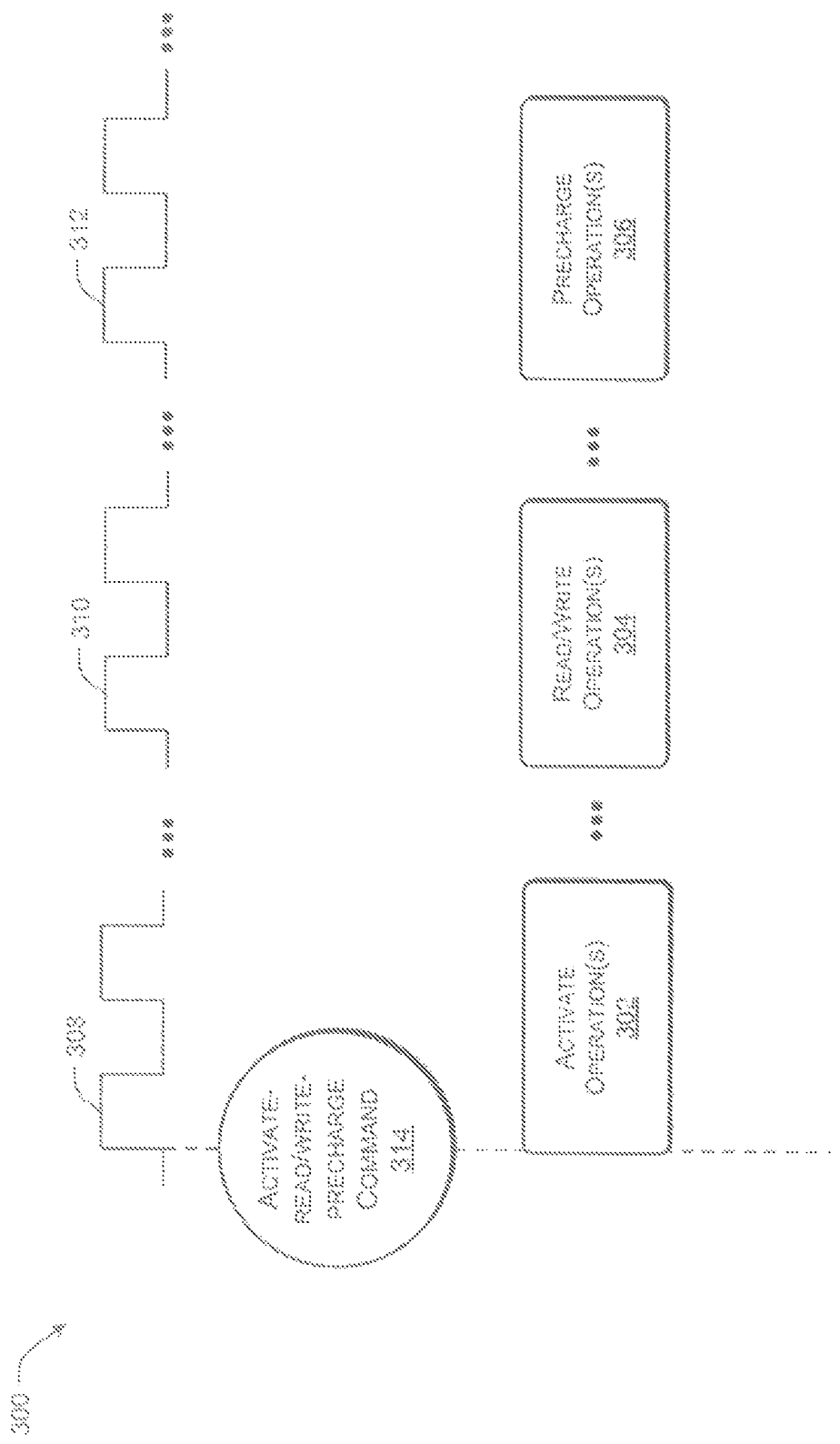
FIG. 3 illustrates yet another example timing diagram associated with processing commands at a memory device according to some implementations.

FIG. 3 illustrates yet another example timing diagram 300 associated with processing commands at a memory device according to some implementations. As with the timing diagrams 100 and 200 of FIGS. 1 and 2, the timing diagram 300 of FIG. 3 illustrates events associated with an external source (e.g., a memory device controller) accessing a page of data from the memory device. The timing diagram 300 is illustrated from the perspective of the memory device as the memory device receives commands from the external source and performs one or more activate operations 302 to load one or more pages of data of the internal page size into a cache, one or more read and/or write operations 304 to read or edit the data stored in the cache, and one or more sets of precharge operations 306 to write the data in the cache back to the memory device.

The timing diagram 300 is illustrated based on clock signals and includes illustrated clock signals 308, 310, and 312. It should be understood that a length of time of each of clock signals, a length of time between each of the clock signals, and a total number of clock signals, as well as the number of clock signals to perform each of the illustrated operations are implementation details and that additional clock cycles may exist between clock signals 308 and 310, between clock signals 310 and 312, and following clock signal 312.

In the illustrated example, the external device may issue a single activate-read/write-precharge command 314 to cause the memory device to load a page into the cache, access the cache, and to write the cache back to the memory array. For example, in one implementation, the activate-read/write-precharge command 314 may be configured to designate a command type, for instance, no operation, activate-write-precharge, activate-read-precharge, or activate-read-modify-write-precharge, a row address and/or a bank address to identify a page to be accessed, as well as the burst length or size of the page.

The no operation command may cause the memory device to wait a predetermined number of cycles associated with processing a command. The activate-write-precharge command may cause the memory device to load a page into the cache, write data to the page, write the page back to the memory array, and close the bank to prepare the array for a subsequent command within the predetermined number of cycles. The activate-read-precharge command may cause the memory device to load a page into the cache, read data associated with the page from the cache, and close the bank to prepare the array for a subsequent command within the predetermined number of cycles. The activate-read-modify-write-precharge command may cause the memory device to load a page into the cache, read data from the cache, write data to the page, write the page back to the memory array, and close the bank to prepare the array for a subsequent command within the predetermined number of cycles.

In another example, the activate-read-modify-write-precharge command may be replaced with an activate-read command without precharge. For instance, in some situations, when the activate-read-modify-write-precharge command is used, insufficient time may be allocated for processing each command to load the data into the cache, read the cache bits, write the cache bits, and write the cache bits back into the memory array. Therefore, in some cases, the memory device may be configured to receive an activate-read command that loads the page into the cache, reads the data from the cache bits once loaded, and closes the bank to prepare the array for a subsequent command. In these cases, the memory device may follow the activate-read command by an activate-write-precharge command to edit the data stored in the cache, write the data back into the memory array, and close the bank to prepare the array for a subsequent activate command. In one particular example, the type of command 314 may be designated using a 2 bit encoding, such as "00", "01", "10", and "11", as will be described in more detail below with respect to FIG. 4.

Figure 4:
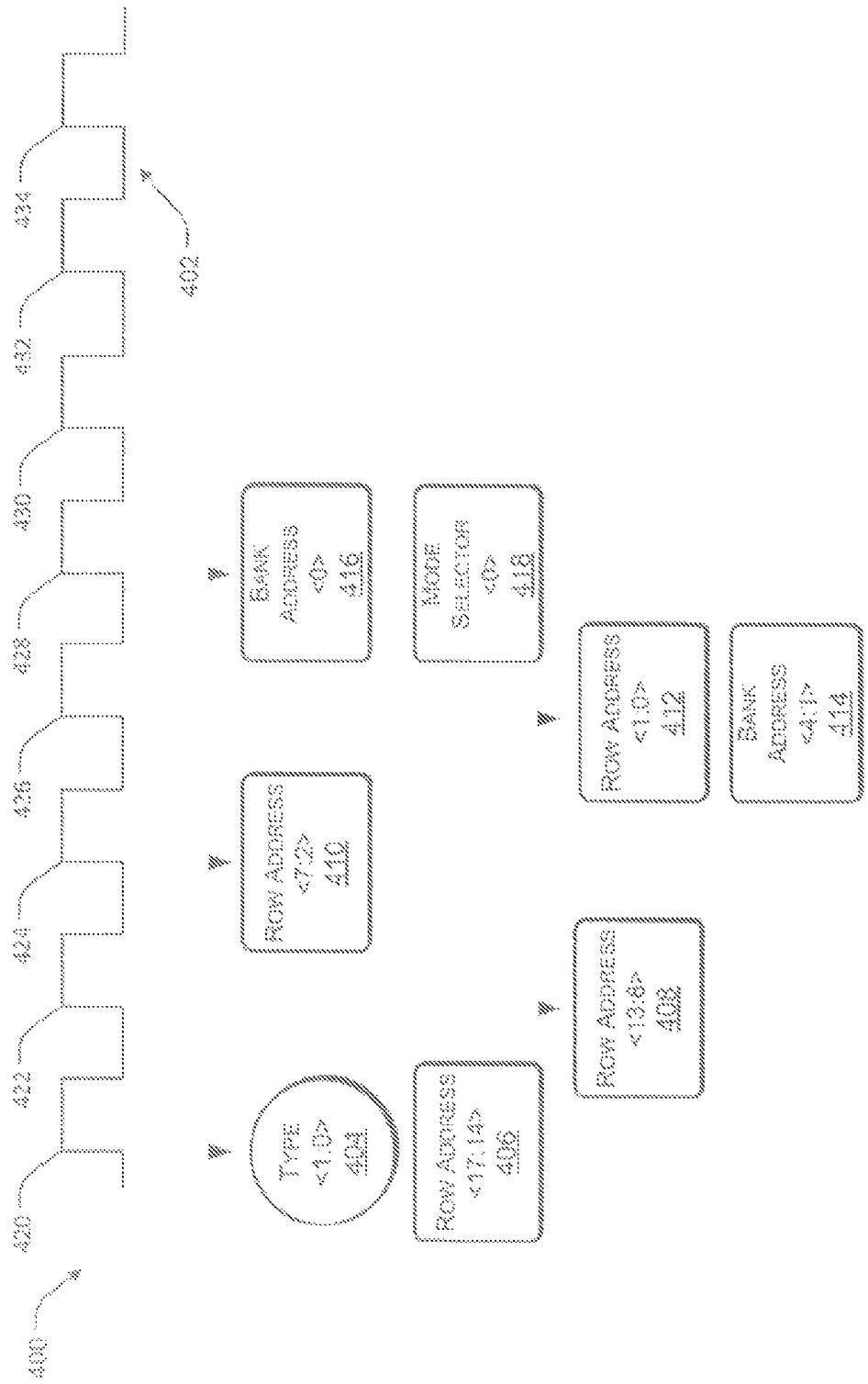
FIG. 4 illustrates an example timing diagram associated with an activate-read/write-precharge command according to some implementations.

FIG. 4 illustrates an example timing diagram 400 associated with an activate-read/write-precharge command. In general, the memory device is receiving a combined activate-write/read-precharge command from an external source accessing the data stored within the memory device. In the illustrated example, the timing diagram 402 illustrates a memory device configured to receive a command during an 8 clock cycle window including clock cycles 420-434. In the illustrated example, the memory device is configured to read 6 pins based on a single data rate (e.g., 6 pins may be read on the rising edge of each clock signal 420-434). In this example, the memory device is receiving a command associated with a 16× burst length. It should be understood that the number of clock cycles associated with receiving a command and the number of pins available to the memory device for reading the command is an implementation detail and may vary.

In some implementations, the memory device may be configured to receive a 2 bit type indictor 404 as the first part of the command. For example, using the 2 pins, the memory device may be configured to read a "00" as no operation, "01" as an active-read-precharge, "10" as an activate-write-precharge, and "11" as an activate-read-modify-write-precharge.

As described above, the no operation command may cause the memory device to wait a predetermined number of cycles assigned to complete the processing of the command. The activate-write-precharge command may cause the memory device to load a page into the cache, write data to the page, to write the page back to the memory array, and close the bank to prepare the array for a subsequent command within the predetermined number of cycles. The activate-read-precharge command may cause the memory device to load a page into the cache, read data associated with the page from the cache, and close the bank to prepare the array for a subsequent command within the predetermined number of cycles.

The activate-read-modify-write-precharge command may cause the memory device to load a page into the cache, read data from the cache, modify data in the cache, to write the cache bits back to the memory array, and close the bank to prepare the array for a subsequent command within the predetermined number of cycles. In some cases, the activate-read-modify-write-precharge command is included as part of the command subset, for the instances, in which a read followed by a write is desirable. If the memory device were to implement only the activate-read-precharge and the activate-write-precharge commands, energy may be wasted as the activate operations are performed twice and the precharge operations are performed twice (e.g., the page is written to the cache twice).

In another example, the "11" identifier may be assigned to an activate-read command without precharge. For instance, in some situations, when the activate-read-modify-write-precharge command is used, insufficient time may be assigned to each command for the data in the cache to be read, modified, and written. Therefore, in some cases, the memory device may be configured to receive an activate-read command to load the page into the cache and to read the page once loaded. The activate-read command may then be followed by the activate-write-precharge command to edit the data stored in the cache and write the data back into the memory array.

In the illustrated example, the memory device is receiving a read/write command associated with a 32 byte page or a 16× burst length. Thus, the memory device may read the row address or page address within 4 of the 8 clock cycles 420-432. For example, as illustrated, row address bits 17-14, generally indicated by 406, may be received on the clock cycle 420 together with the type indictor 404. The row address bits 13-8, generally indicated by 408, may be received on the clock cycle 422. The row address bits 7-2, generally indicated by 410, may then be received on the clock cycle 424 and the row address bits 1-0, generally indicated by 412, may be received on the clock cycle 426.

In some cases, each command may also include a bank address, such as when the memory device includes multiple memory arrays. In the illustrated example, part of the bank address may be received together with the row address bits 1-0 on the clock cycle 426, as indicated by bank address 414, and the remainder received on the clock cycle 428, as indicated by bank address 416. Together, the row address and bank address bits may define the address of a page to be accessed during the read/write operation.

In some specific implementations, the command may also include one or more pins associated with a mode selector 418 to define a burst length or a number of bits to be accessed. For example, in some cases, the page size or burst length may be selected or set as part of the activate command, as described above. In these cases, one or more mode selector bits 418 may be included as part of the combined activate-read/write-precharge command. For instance, the number of modes that may be selected with the mode selector bits 418 may be associated with the burst length and may be based on a size of the arrays associated with the memory device. For example, in one particular implementation, the memory device may be arranged with arrays having 32 bytes. In some examples, the memory device may be configured such that each array may be accessed or activated individually. Thus, in this example, the memory device may allow the external source to select between a burst length of 16× (e.g., 16 words per page, each word containing 2 bytes, a page size of 32 bytes, or a page equal to a single array) and 32× (e.g., 32 words per page, each word containing 2 bytes, a page size of 64 bytes, or a page equal to two arrays) using a single mode selector bit 418. In the illustrated example, the external source has selected a 16× burst length and provided a corresponding memory address to access a page size or an address associated with a single bank, thereby reducing power consumption associated with each command.

In the illustrated example, the burst length is set via the mode selector bit 418. However, in other examples, the mode selector bit 418 may be replaced by one or more fuse programmable registers set at the time of manufacture or installation of the memory device. Alternatively, an initialization register set as part of an initialization or power-on sequence may indicate the burst length. Additionally, the while the mode selector bit 418 is shown as the last bit of a command, in other implementations, the mode selector bit 418 may be the first bit of the command, part of the type indicator bits 404, and/or adjunct to the type indicator bits 404 in the command.

Figure 5:
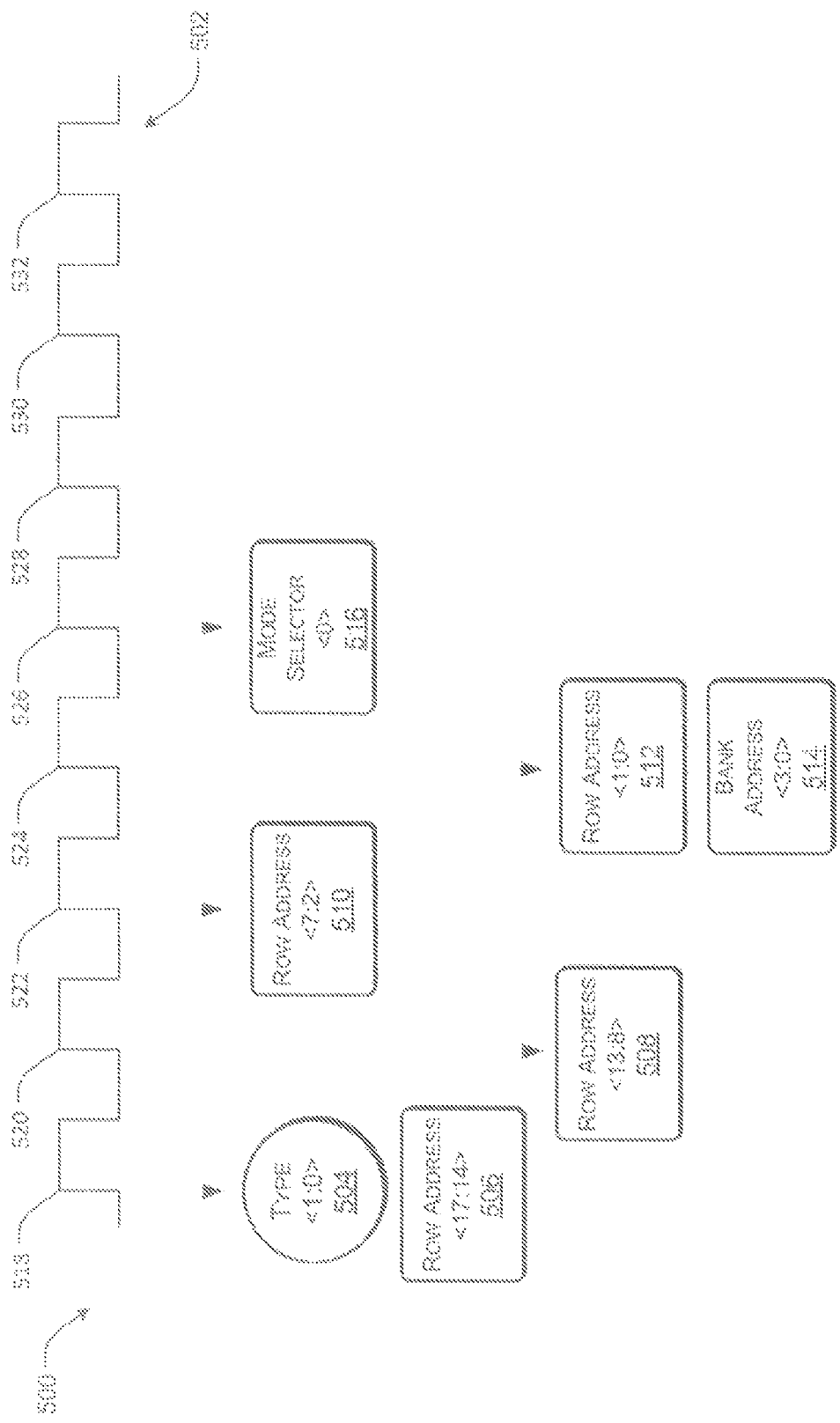
FIG. 5 illustrates an example timing diagram associated with an activate-read/write-precharge command according to some implementations.

FIG. 5 illustrates another example timing diagram associated with receiving an activate-read/write-precharge command according to some implementations. In the illustrated example, the timing diagram 502 illustrates a memory device configured to receive a command during an 8 clock cycle window including clock cycles 518-532. In the illustrated example, the memory device is configured to read 6 pins based on a single data rate (e.g., 6 pins may be read on the rising edge of each clock signal 518-532). In other examples, it should be understood that while the number of clock cycles and pins may be fixed, the particular number of clock cycles assigned for reading a command or the particular number of pins available for receiving the command is an implementation detail and may vary.

In the illustrated example, the memory device is receiving a command associated with a 32× burst length rather than the 16× burst length illustrated with respect to FIG. 4. The memory device may be configured to receive a 2 bit type indictor 504 as the first part of each command. Again, using the 2 pins, the memory device may be configured to read a "00" as no operation, "01" as an active-read-precharge, "10" as an activate-write-precharge, and "11" as an activate-read-write-precharge.

The no operation command may cause the memory device to wait a predetermined number of cycles assigned to complete the processing of the command. The activate-write-precharge command may cause the memory device to load a page into the cache, write data to the cache bits, to write the data in the cache back to the memory array, and close the bank to prepare the array for a subsequent command within the predetermined number of cycles. The activate-read-precharge command may cause the memory device to load a page into the cache, read data associated with the page from the cache, and close the bank to prepare the array for a subsequent command within the predetermined number of cycles. The activate-write-read-precharge command may cause the memory device to load a page into the cache, read data from the cache, write data to the cache bits, write the cache bits back to the memory array, and close the bank to prepare the array for a subsequent command within the predetermined number of cycles.

As discussed above, in the illustrated example, the memory device is receiving a read/write command associated with a 64 byte page or a 32× burst length. Thus, the memory device may receive bits associated with a row address as follows: the row address bits 17-14, generally indicated by 506, may be received on the clock cycle 518 together with the type indictor 504. The row address bits 13-8, generally indicated by 508, may be received on the clock cycle 520 and the row address bits 7-2, generally indicated by 510, may be received on the clock cycle 522. Finally, the row address bits 1-0, generally indicated by 516, may be received on the clock cycle 526.

In some cases, the command may also include a bank address. In the illustrated example, the bank address may be received together with the row address bits 2-0 on the clock cycle 524, as indicated by bank address 514. Together, the row address and the bank address may define a page address that is being accessed during the read/write operation(s). In the illustrated example, the bank address 514 includes one less bit than the bank address 414 of FIG. 4, as when the 32 byte page size is activated the number of pages is reduced as the number of arrays associated with each page is increased. For instance, in this example, the number of pages is reduced by a multiple of two, as two arrays are now activated when each page is accessed. Thus, as long as a number of clock cycles is available to read the command associated with the smallest page size, the memory device may offer a wide variety of page sizes.

The illustrated example, also includes a mode selector bit 516. As discussed above the mode selector bit 516 may be utilized to indicate the page size associated with the particular command being received. In some examples, the mode selector bit 516 may include multiple bits, for instance, when more than two page sizes are implemented by a memory device. In other examples, the mode selector bit 516 may be included as one or more additional bits associated with the type indictor 504 and/or associated or arranged adjacent to the type indictor bits 504 within the command.

In other examples, the mode selector bit 516 may not included as part of the each command. For example, the memory device may be configured to recognize the lack of a mode selector bit 516 as a selection of default burst length, i.e. in this example, the 32× burst length. In some examples, the additional clock cycles 538-532 may be utilized, for instance, to read additional mode selector bits to designate the burst length and/or page size and/or as bits to identify a starting point within the page for the read/write operation.

Figure 6:
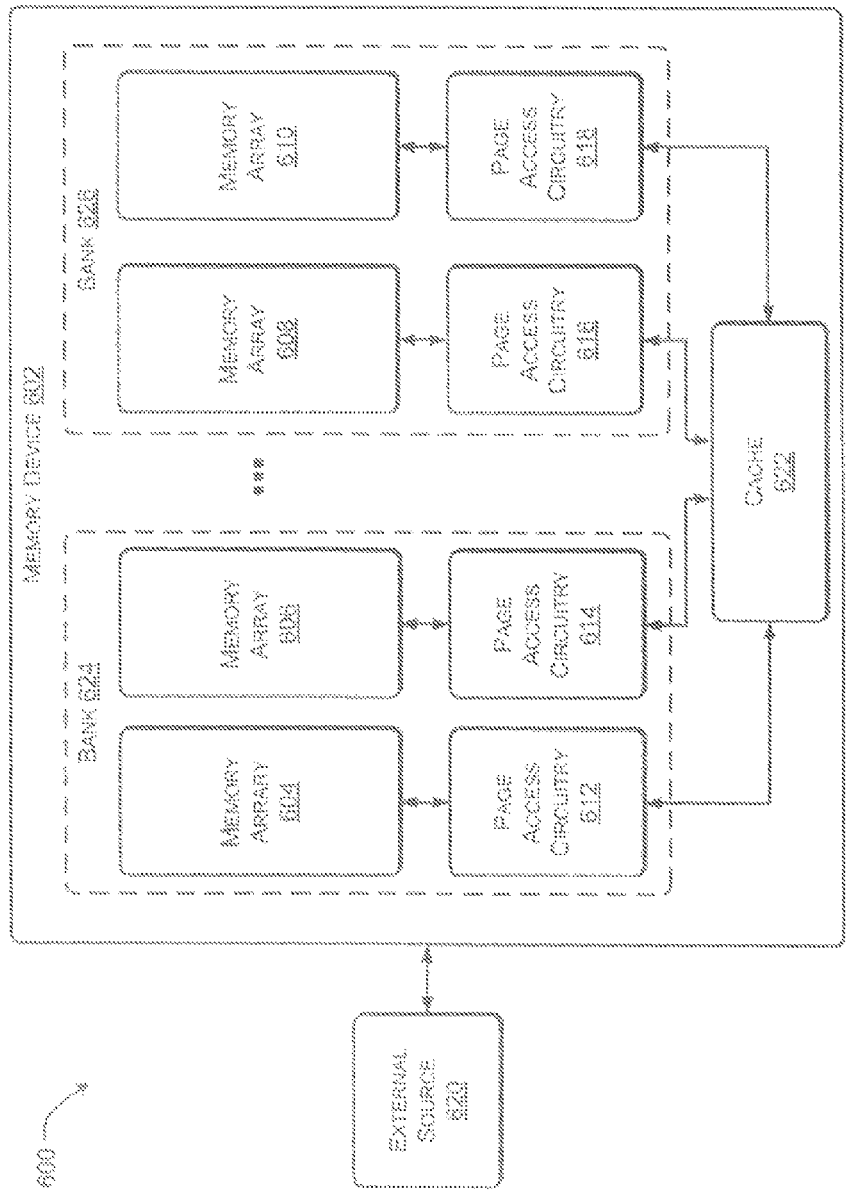
FIG. 6 illustrates an example block diagram of select components of a memory device in which memory arrays are configured to be independently accessible to an external source.

FIG. 6 illustrates an example block diagram 600 of select components of a memory device 602 in which memory arrays 604, 606, 608, and 610 are configured to be accessed independently. For instance, in the illustrated example, each of the memory arrays 604, 606, 608, and 610 are associated with dedicated page access circuitry 612, 614, 616, and 618 to allow each array 604-610 to be accessible independently of the other arrays 604-610. In general, the memory device 602 is configured to receive access requests form an external source 620 and to write data stored in the memory arrays 604-610 via the associated page access circuitry 612-614 into a cache 622.

The memory device 602 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that can be used to store information. In one particular example, the memory device may be a magnetic memory or magnetic disk storage, such as an MRAM device.

In some implementations, each memory array 604-610 maybe associated with a particular row or page size of data. In the illustrated example, each memory array 604-610 is configured to be accessed via the associated page access circuitry 612-618 independently of the other arrays. In some cases, the page access circuitry 612-618 may be configured to read and/or write one page of data to or from the arrays 604-610 at a time. Some non-limiting example components of the page access circuitry 612-618 may include row selection circuitry, sense amplifiers, write drivers, and/or charge pumps. In the illustrated example, memory device 602 includes four arrays 604-610. However, it should be understood that the memory device 602 may include any number of arrays 604-610 depending on the size and configuration of the memory device 602. In the illustrated example, each memory array 604-610 has an associated page access circuitry 612-618, in some cases, two or more of the arrays 604-610 may be share the same page access circuitry or particular components of the page access circuitry.

In general, one or more of the memory arrays 604-610 are configured to be accessed as a single page or a single bank. For instance, in the illustrated example, memory arrays 604 and 606 are configured to be accessed together, as bank 624, and memory arrays 608 and 610 are configured to be accessed together, as bank 626. However, in other examples, each memory arrays 604-610 may be accessed as a single page or bank and/or more than two arrays may be accessed in response to a command from the external source 620.

In one particular example, each array 604-610 may be associated with 256 bits internal page size and the memory device may include options for accessing a bank of data as either a 256 bit page or a 512 bit page. Additionally, in some examples, the memory device 602 may be configured to receive activate commands that identify a burst length of either 16× (256 bits) or 32× (512 bits) and to define the size of each bank. In other examples, the burst length or page size may be set via a fuse programmable register set during manufacturing or the memory device 602 and/or an initialization or mode register set as part of a power up sequence. Thus, in some examples, the number of arrays associated with each of the banks 624 and 626 may be defined or set in response to receiving the selection of the burst length.

Regardless of how the burst length is defined, the memory device 602 may be configured such that each of the arrays 604-610 may be accessed or read individually from the other arrays. Thus, the memory device 602 described herein may utilize the defined burst length to define an associated page size that may be accessed via a single address. For example, if the burst length is set to 32×, the memory device 602 may load the bank 624 or the bank 626 of data associated with two memory arrays 604-610 into the cache 622, in response to receiving each command from the external source 620. The two arrays being associated with two internal pages or equal to a 512 bit banks. However, in some cases, less than the 512 bits may be accessed during a particular read and/or write operation. Therefore, in other examples, as illustrated below with respect to FIG. 7, the external source 614 may select a 16× burst length and the memory device 602 may implement a 256 bit page size. In this example, the memory device 602 may activate a single array 604-610, in response to receiving each command. In this manner, when a read/write command is received from the external source 620, the memory device 602 may load fewer bits into the cache 622, thereby reducing the power consumption associated with extraneous bits being flipped and, thus, reducing the energy consumption rate of the magnetic memory device 602.

Figure 7:
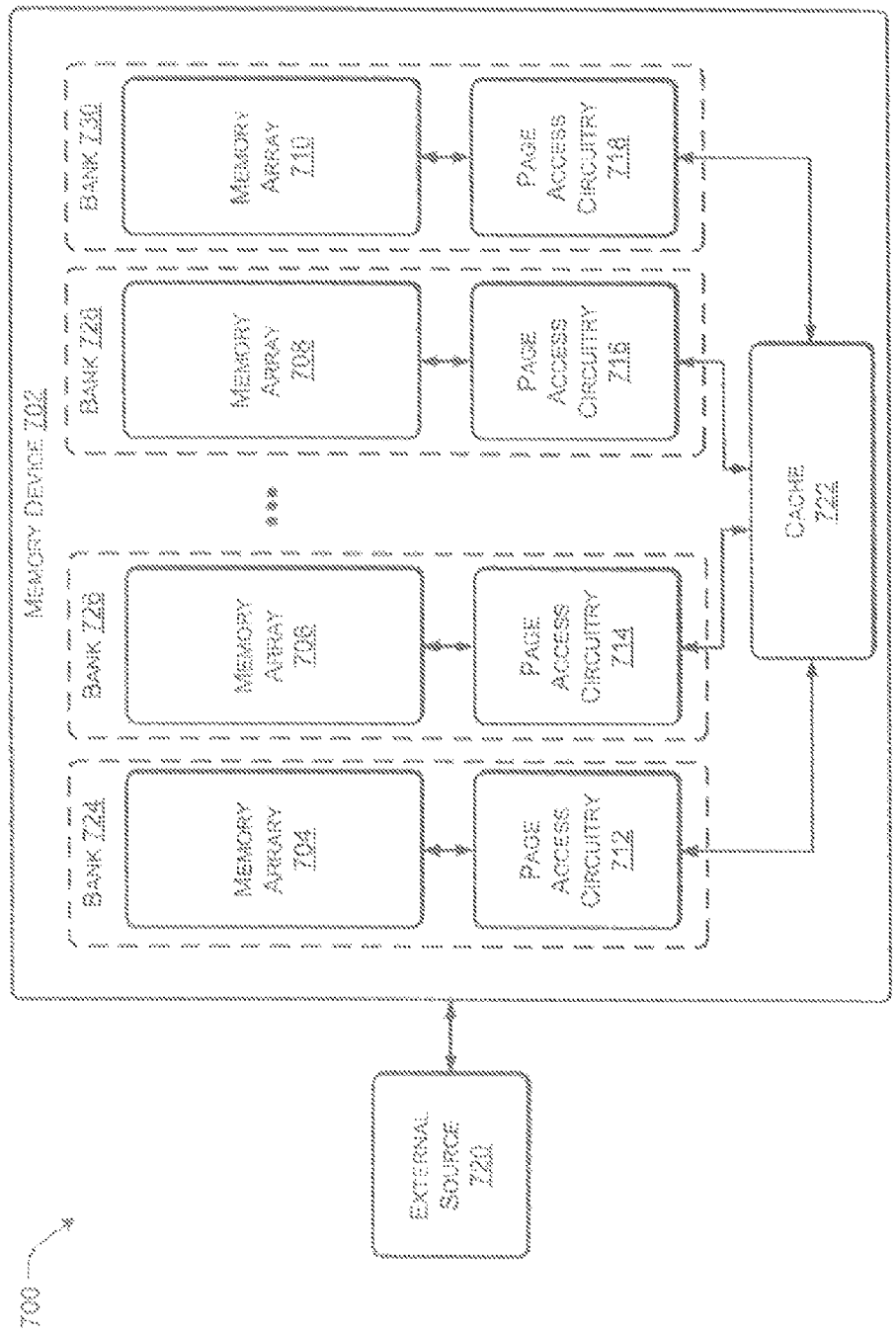
FIG. 7 illustrates another example block diagram of select components of a memory device in which memory arrays are configured to be independently accessible to an external source.

FIG. 7 illustrates another example block diagram 700 of select components of a memory device 702 including memory arrays 704, 706, 708, and 710. Similar to FIG. 6 above, each of the memory arrays 704, 706, 708, and 710 are respectively associated with dedicated page access circuitry 712, 714, 716, and 718 in order to be accessible independently from each other. In general, the memory device 702 is configured to receive access requests from an external source 720 and to write data stored in the memory arrays 704-710 via the associated page access circuitry 712-714 into a cache 722.

In the illustrated example, memory device 702 includes four arrays 704-710 and each memory array 704-710 may be associated with a particular row or page size of data. However, it should be understood that the memory device 702 may include any number of arrays 704-710 depending on the size and configuration of the memory device 702 and while, in the illustrated example, each memory array 704-710 has an associated page access circuitry 712-718, in some cases, two or more of the arrays 704-710 may be share the same page access circuitry or particular components of the page access circuitry.

In general, one or more of the memory arrays 704-710 are configured to be accessed as a single page or a single bank. For instance, each memory array 704-710 is configured to be accessed as a bank, generally indicated by banks 724, 726, 728, and 730. In other examples, multiple memory arrays 704-710 may be accessed as a single page or bank, for instance, as illustrated above with respect to FIG. 6.

In one particular example, each array 704-710 may be associated with 256 bits internal page size and the memory device may include options for accessing a bank of data as either a 256 bit page or a 512 bit page. Additionally, in some examples, the memory device 702 may be configured to receive activate commands that identify a burst length of either 16× (256 bits) or 32× (512 bits) and to define the size of each bank. In other examples, the burst length or page size may be set via a fuse programmable register set during manufacturing or the memory device 602 and/or an initialization or mode register set as part of a power up sequence.

Thus, in some examples, the number of arrays associated with each of the banks 724-730 may be defined or set in response to receiving the selection of the burst length.

In the illustrated example, the burst length is set to 16× and the memory device 702 loads banks 724-730 of data equal to a single memory array 704-710 into the cache 722, in response to receiving each command from the external source 720. Thus, each array 704-710 is associated with a single internal page is accessed as a single bank 724-730 and equal to 256 bits. However, in some cases, more than the 256 bits may be accessed during a particular read and/or write operation.

While FIGS. 1-7 are described with respect to a 16× and 32× burst length and/or page size, it should be understood that the particular burst lengths and page sizes are an implementation detail and may vary. For example, in some examples, the memory device may be configured to receive a command associated with a 4× and 8× burst length. In this example, the memory device may include 64 bit memory arrays. In other examples, the memory device may be configured to receive more than two predefined burst lengths and to implement any number of page sizes. For instance, an additional mode selector bit may be associated with a command, and the memory device may be configured to receive a selection between four different burst lengths.

Figure 8:
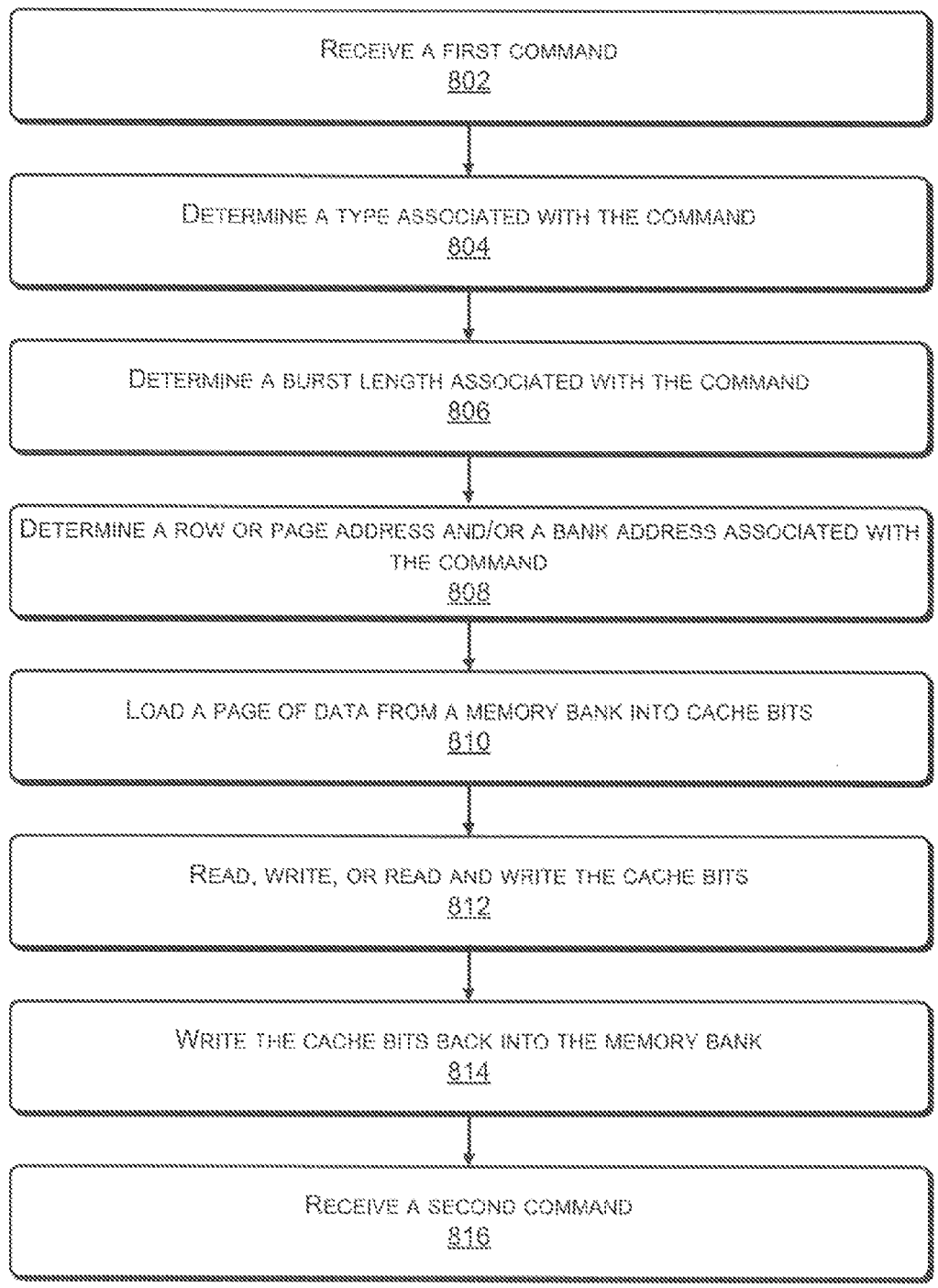
FIG. 8 an example flow diagram showing an illustrative process for implementing a reduced command set and burst length defined page size according to some implementations.

FIG. 8 is a flow diagram illustrating an example process of a memory device implementing a combined command set and burst length defined page size. The process is illustrated as a collection of blocks in a logical flow diagram, which represents a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 8 illustrates an example flow diagram showing an illustrative process 800 for implementing a reduced command set and burst length defined page size according to some implementations. In general, the process 800 may be implemented by a memory device configured with a reduced command set and page defined burst length. The reduced command set may include commands configured to perform auto activate and auto precharge operations. For example, the command set may include a no operation command (e.g., a wait command), an activate-read-precharge command, an activate-write-precharge command, and an activate-read-modify-write-precharge command. In some instances, the activate-read-modify-write-precharge command may be replaced with an activate-read command without precharge. For example, in some situations, when the activate-read-modify-write-precharge command is used, insufficient time may be allocated to perform a command to carry out the activate operations, the read operations, the write operations, and the precharge operations, as well as to receive the modification of the data. Therefore, in some cases, the memory device may be configured to receive an activate-read command, to load the page into the cache and to read the page, followed by an activate-write-precharge command, to edit the data stored in the cache and write the cache bits back into the memory array.

The page defined burst length may be configured at the time of manufacture or installation of the memory device into a larger assembly, for example, through the use of a fuse programmable register. Alternatively, the page defined burst length may be set as part of an initialization or power-on sequence and/or a mode register set on the fly in response to parsing an activate command received from the external source.

At 802, the memory device receives a command (for example, the command as described above with respect to FIGS. 4 and 5) from an external source, such as a memory device controller. In general, the memory device may be configured to receive the command via a predefined number of pins over a predefined number of clock cycles.

At 804, the memory device determines the type of command being issued from the external source. For example, the command may include a type indicator (for example, a two bit or pin identification). In one particular implementation, the command may include a type indictor as follows: "00" may be assigned to no operation, "01" may be assigned to active-read-precharge, "10" may be assigned to activate-write-precharge, and "11" may be assigned to activate-read-modify-write-precharge. Thus, the memory device may read the type indicator as the first bits associated with the command and determine based on the first bits whether the command is associated with a no operation, an active-read-precharge, an activate-write-precharge, and/or an activate-read-modify-write-precharge or activate-read.

At 806, the memory device determines a burst length associated with the command. For example, the command may also include one or more mode selector bits to define a burst length and, thereby, define a page size to be accessed during a read/write operation. In one particular implementation, the memory device may be configured to receive predetermined burst lengths based on internal page size of a memory array associated with the memory device. For instance, in a particular example, the memory arrays may be configured to be independently accessible. Thus, the memory device may be configured to receive a mode selector bit as part of the command indicting either a burst length of 16× (e.g., a single array of the memory device is activated) or a burst length of 32× (e.g., two arrays of the memory device are activated). In other examples, multiple mode selector bits may be utilized when more than two page sizes are available. For instance, if the memory device is configured to implement 8×, 16×, 32×, and 64× page sizes.

In other instances, the command may include an indication of the burst length, as well as a starting position within the page to provide a memory device in which the burst length may be tailored closely to the number of bits being accessed. In this instance, the burst length and page size may be variable within a window or range rather than predetermined values, as described above.

At 808, the memory device determines a row or page address and/or a bank address associated with the command. For instance, following the type indicator, the command may also include a row address and/or a bank address for accessing a page of data. In some implementations, the page size is defined such that each read/write operation accesses a single page of data from a memory bank. In this implementation, the command may not include a column address, as the entire page associated with a row may be accessed.

At 810, the memory device loads a page of data from a memory array into cache bits. For example, once the memory device determines the type of command and the row address, the memory device may perform the operations associated with an activate command (e.g., to load the page of data into the cache bits for access by the external source).

At 812, the external source reads, writes, or reads/writes the data stored within the cache bits. For example, if the command is an activate-read-precharge command, the memory device may perform the activate operations and the cache bits may be read by the external source or the read operations may be performed. However, if the command is an activate-write-precharge command, the memory device may perform the activate operations and the cache bits may be edited by the external source or the write operations may be performed. If the command is an activate-read-modify-write-precharge command, the memory device may perform the activate operations and the read operations may be performed followed by the write operations.

At 814, the memory device writes the cache bits back into the memory bank. For example, regards of the type of command received, once the cache bits are read, written, and/or both, the memory device performs the precharge operations following the expiration of a time period assigned to the read/write operations to write the data stored in the cache bits back into the memory bank. In some instances, the memory device is configured to perform auto precharge operations following each read/write command. In these instances, due to the fact that magnetic memory may remain volatile until a precharge is performed, the memory device experiences improved reliability rates and reduced error rates.

At 816, the memory device receives a second command and the process 800 may repeat. In some cases, the number of clock cycles assigned to read and analyze the command is predetermined, for example, during manufacturing of the memory device. In other cases, the number of clock cycles assigned to perform each of the command parts (e.g., the activate, read/write, and precharge commands) may be fixed or predetermined by the external source accessing the memory device. In this case, the memory device may have a combined time to perform the operations associated with the command including the auto activate and auto precharge allowing for a more flexible and/or more efficient use of the clock cycles. For example, in some instances, memory devices may require additional cycles to perform the precharge operations but fewer cycles to perform the activate operations. Therefore, in memory devices utilizing the reduced command set, the clock cycles assigned to the activate operations may be utilized during the precharge operations improving the overall design freedom associated with configuring the memory device.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A method comprising:
    receiving, at a magnetic memory device, a single command, wherein the single command includes a predetermined series of commands from an external source, wherein the predetermined series of commands includes an activate command, the activate command is issued prior to a read or write command, and the read or write command is issued prior to an auto precharge command;
    in response to the activate command, opening a page associated with a memory bank;
    determining a row address associated with the activate command, the row address indicating the page associated with the memory bank;
    determining a burst length associated with the activate command based at least in part on a first mode selector bit included in the activate command, wherein the burst length defines a page size associated with the read or write command;
    determining a starting position within the page associated with the memory bank based at least in part on a second mode selector bit included in the activate command, the starting position indicating a first bit to load into a cache;
    performing a self-referencing read operation on the defined page size associated with the read or write command;
    loading a number of bits starting with the first bit into the cache, the number of bits equal to the burst length; and
    in response to the auto precharge command, closing the page associated with the memory bank, and writing the number of bits from the cache back into the memory bank after an expiration of a first number of clock cycles, the first number of clock cycles associated with a number of clock cycles for the external source to access the cache bits.

2. The method as recited in claim 1, wherein the predetermined series of commands of the single command is at least one of:
    an activate-read-precharge command;
    an activate-write-precharge command; or
    an activate-read-modify-write-precharge command.

3. The method as recited in claim 1, wherein the burst length is determined based at least in part on one of the following:
    a fuse programmable register;
    an initialization register; or
    a mode register set in response to at least one mode selector bit associated with the predetermined series of commands of the single command.

4. The method as recited in claim 1, wherein the burst length is determined based at least in part on a number of independently activatable banks associated with the magnetic memory device.

5. The method as recited in claim 1, wherein the burst length is selected from a group of predetermined burst lengths associated with the magnetic memory device.

6. An electronic device comprising:
    a magnetic memory device including:
        multiple memory banks;
        multiple page access circuits, wherein each page access circuit of the multiple page access circuits is associated with at least one memory bank of the plurality of memory banks, and wherein each page access circuit of the multiple page access circuits is configured to allow each memory bank of the magnetic memory device to activate independently of the other memory banks; and
        a cache configured to receive data stored in at least one memory bank of the multiple memory banks; and
    an external source coupled to the magnetic memory device and the cache, wherein the external source is configured to (i) issue a single command to the magnetic memory device, wherein the single command includes a predetermined series of commands, wherein the predetermined series of commands includes an activate command, wherein the activate command is issued prior to a read or write command, and wherein the read or write command is issued prior to an auto precharge command, and (ii) access data loaded into the cache, wherein the activate command causes the magnetic memory device to open a page, perform a self-referencing read operation on the data to be loaded into the cache, and load data stored in the at least one memory bank into the cache, wherein the activate command includes a first mode selector bit configured to identify a starting position within the at least one memory bank, wherein the activate command includes a second mode selector bit to define a variable burst length, and wherein the auto precharge command closes the page and causes the data in the cache to be written back to the at least one memory bank.

7. The electronic device as recited in claim 6, wherein the starting position identifies a first bit within a page to load into the cache.

8. The electronic device as recited in claim 6, wherein the predetermined series of commands of the single command is at least one of:
an activate-read-precharge command;
an activate-write-precharge command; or
an activate-read-modify-write-precharge command.

9. A magnetic memory device comprising:
multiple banks;
page access circuitry coupled to the multiple banks and configured to:
receive an activate command from an external source, wherein the activate command is issued prior to a read or write command, and wherein the read or write command is issued prior to an auto precharge command, wherein the activate command includes a first mode selector bit configured to identify a first bit within a page to load into cache bits, and wherein the activate command includes a second mode selector bit to define a page size associated with the magnetic memory device;
open the page, perform a self-referencing read operation on the defined page size, and load the defined page size into cache bits in response to receiving the activate command; and
close the page and write data back from the cache in response to receiving the auto precharge command; and
at least one register, a value of the register indicating a burst length associated with the magnetic memory device, wherein the burst length is based at least in part on a first size of individual ones of the multiple banks, and wherein the burst length defines the page size associated with the magnetic memory device.

10. The magnetic memory device as recited in claim 9, wherein an amount of data loaded into the cache bits is a multiple of the first size of individual ones of the multiple banks.

11. The magnetic memory device as recited in claim 9, wherein an amount of the data loaded into the cache bits is based at least on the page size.

12. The magnetic memory device as recited in claim 9, wherein the burst length is a first burst length or a second burst length, the first burst length defining a page size of the first size and the second burst length defining a page size that is twice the first size.

13. The magnetic memory device as recited in claim 12, wherein:
the activate command includes an address of a first number of bits when the burst length is the first burst length; and
the activate command includes an address of less than the first number of bits when the burst length is the second burst length.

14. The magnetic memory device as recited in claim 12, wherein the register is at least one of:
a fuse programmable register set during assembly of the magnetic memory device;
an initialization register set during initialization of the magnetic memory device; or
a mode register set in response to receiving the activate command.

15. The magnetic memory device as recited in claim 12, wherein the page access circuitry includes dedicated page access circuitry for each of the multiple banks and each of the multiple banks may be activated independently from other banks of the multiple banks.

16. The method as recited in claim 1, wherein the first bit is between a first bit of the page and a last bit of the page.

17. The electronic device as recited in claim 6, wherein the starting position is between a first bit of the page and a last bit of the page.

18. The electronic device as recited in claim 7, wherein the first bit is between a first bit of the page and a last bit of the page.

19. The method as recited in claim 1, wherein the burst length is configured to reduce energy consumption during the self-referencing read operation.

* * * * *